(12) United States Patent
Zhang et al.

(10) Patent No.: US 11,415,611 B2
(45) Date of Patent: Aug. 16, 2022

(54) CAPACITANCE MEASURING SYSTEM AND METHOD

(71) Applicant: TEXAS INSTRUMENTS INCORPORATED, Dallas, TX (US)

(72) Inventors: Jun Zhang, Shanghai (CN); Yaohua Pan, Shanghai (CN)

(73) Assignee: Texas Instruments Incorporated, Dallas, TX (US)

(*) Notice: Subject to any disclaimer, the term of this patent is extended or adjusted under 35 U.S.C. 154(b) by 263 days.

(21) Appl. No.: 16/741,598

(22) Filed: Jan. 13, 2020

(65) Prior Publication Data
US 2021/0048464 A1 Feb. 18, 2021

Related U.S. Application Data

(63) Continuation of application No. PCT/CN2019/100499, filed on Aug. 14, 2019.

(51) Int. Cl.
| | |
|---|---|
| *G01R 27/26* | (2006.01) |
| *G05F 3/26* | (2006.01) |
| *G06F 3/044* | (2006.01) |
| *H03K 17/96* | (2006.01) |

(52) U.S. Cl.
CPC ......... *G01R 27/2605* (2013.01); *G05F 3/262* (2013.01); *G06F 3/044* (2013.01); *H03K 17/962* (2013.01); *H03K 2217/960725* (2013.01)

(58) Field of Classification Search
CPC ............. G01R 27/2605; H03K 17/962; H03K 17/955; H03K 2217/960725; G06F 3/044; G05F 3/262
See application file for complete search history.

(56) References Cited

U.S. PATENT DOCUMENTS

| | | | |
|---|---|---|---|
| 2013/0285733 A1 | 10/2013 | Chen et al. | |
| 2016/0357284 A1* | 12/2016 | Wu | ............. G06F 3/04182 |

FOREIGN PATENT DOCUMENTS

| | | | |
|---|---|---|---|
| CN | 104571734 A | | 4/2015 |
| CN | 104885366 A | | 9/2015 |
| CN | 105549094 A | | 5/2016 |
| CN | 106249970 A | | 12/2016 |
| CN | 109921633 A | * | 6/2019 |

OTHER PUBLICATIONS

International Search Report for PCT/US2019/100499 dated May 11, 2020.

* cited by examiner

*Primary Examiner* — Amy He
(74) *Attorney, Agent, or Firm* — Brian D. Graham; Charles A. Brill; Frank D. Cimino

(57) ABSTRACT

A system operable between a charging mode and a transferring mode for measuring capacitance of a capacitive sensor, includes a switching unit configured to, in a first phase of the charging mode, arrange the capacitive sensor to be charged by a first supply voltage from a first end of the capacitive sensor until a voltage difference between the first end and an opposite second end of the capacitive sensor reaches a first predetermined voltage, and in a second phase of the charging mode, disconnect the first end of the capacitive sensor from the first supply voltage and couple the second end of the capacitive sensor (10) to a second supply voltage to raise a voltage at the first end of the capacitive sensor to a second predetermined voltage.

15 Claims, 4 Drawing Sheets

CAPACITANCE MEASURING SYSTEM AND METHOD

TECHNICAL FIELD

The present disclosure relates to a capacitive sensor system and, more particularly, to a capacitance measuring system.

BACKGROUND

Capacitive sensor systems are widely used in various applications, for example, in human interface applications to sense touch or proximity of a body, and in motor applications to determine a position of a rotatable shaft of a motor, by detecting a capacitance change between two opposite electrodes of a capacitive sensor.

SUMMARY

The present disclosure relates to capacitive sensor systems that determine touch or proximity to a capacitive sensor by detecting a capacitance change between two opposite electrodes of the capacitive sensor. In a capacitive sensor system, capacitance between the two electrodes of the capacitive sensing plate are measured by repeatedly charging the capacitive sensing plate and transferring charges charged to the capacitive sensing plate to a sample capacitor through a current mirror.

In one example, the present disclosure provides a system operable between a charging mode and a transferring mode for measuring capacitance of a capacitive sensor. The system includes a first input terminal configured to couple a first end of the capacitive sensor and a second input terminal configured to couple a second end of the capacitive sensor, and a switching unit coupled to the first and second ends of the capacitive sensor. The charging mode includes at least first and second phases. In the first phase, the switching unit arranges the capacitive sensor to be charged by a first supply voltage from the first end of the capacitive sensor until a voltage difference between the first and second ends of the capacitive sensor reaches a first predetermined voltage. In the second phase, the switching unit disconnects the first end of the capacitive sensor from the first supply voltage and couples the second end of the capacitive sensor to a second supply voltage to raise a voltage at the first end of the capacitive sensor to a second predetermined voltage.

In another example, the present disclosure provides a system operable between a charging mode and a transferring mode for measuring capacitance of a capacitive sensor. The system includes a first input terminal configured to couple a first end of the capacitive sensor, and a transferring unit with an input node configured to be electrically coupled to the first end of the capacitive sensor in the transferring mode. The transferring unit includes a current mirror that discharges the capacitive sensor with a discharging current until a voltage at the first end of the capacitive sensor decreases to a first predetermined voltage and transfers a number of electric charges to a sample capacitor by mirroring the discharging current, wherein the current mirror receives a reference voltage and sets a bias voltage at the input node of the transferring unit based on the reference voltage, wherein the first predetermined voltage is based on the bias voltage.

In yet another example, the present disclosure provides a method of measuring capacitance of a capacitive sensor. The method includes coupling a first end of the capacitive sensor to a first supply voltage to charge the capacitive sensor from the first end until a voltage difference between the first end and an opposite second end of the capacitive sensor reaches a first predetermined voltage, and disconnecting the first end of the capacitive sensor from the first supply voltage, and coupling the second end of the capacitive sensor to a second supply voltage to raise a voltage at the first end of the capacitive sensor to from the first predetermined voltage to a second predetermined voltage.

DETAILED DESCRIPTION

The present disclosure relates to capacitance measuring systems for measuring capacitance of a capacitive sensor.

Figure 1:
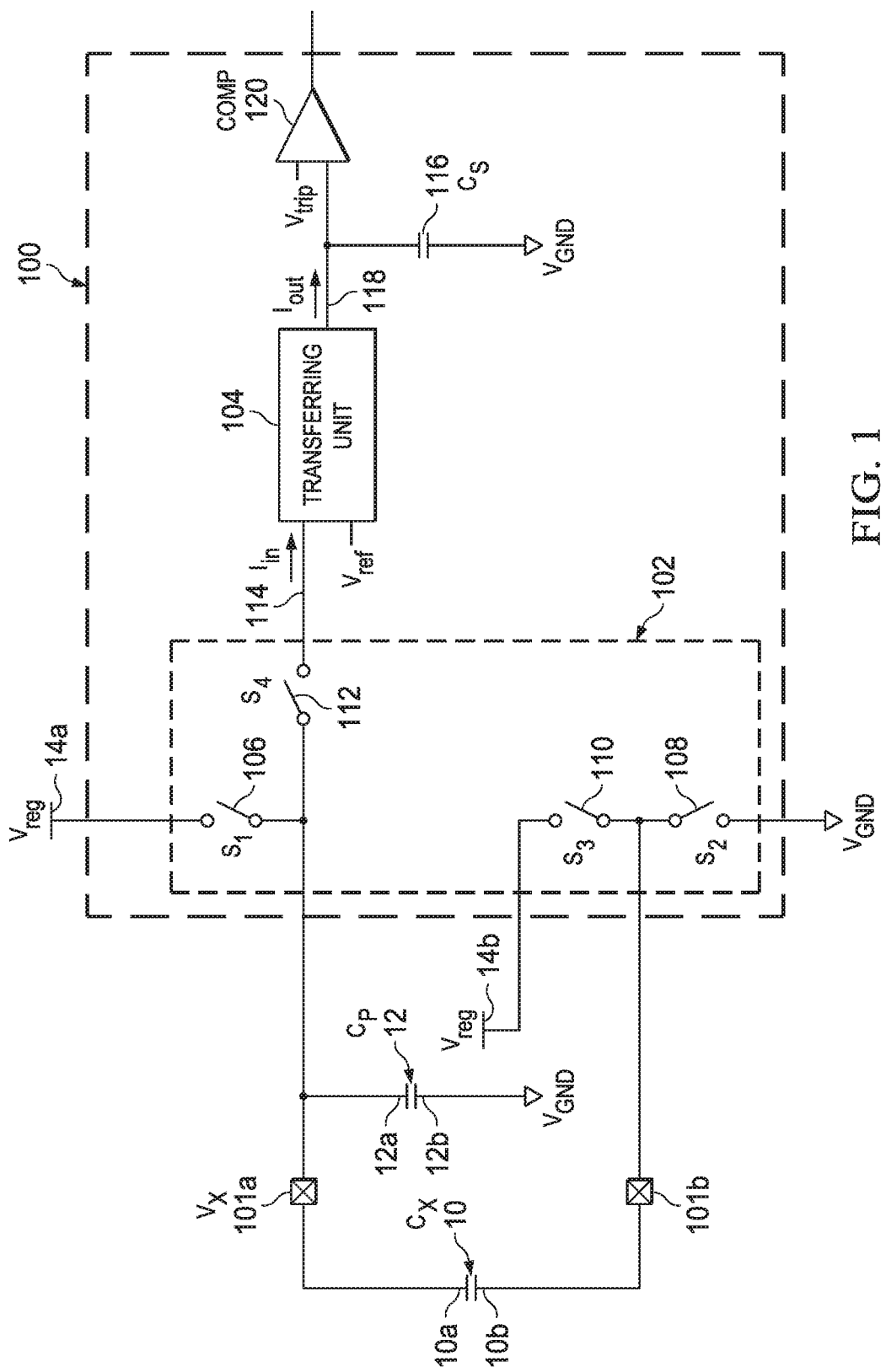
FIG. 1 is a schematic block diagram of a capacitance measuring system in accordance with an embodiment of the present disclosure.

Referring now to FIG. 1, a schematic block diagram of a capacitance measuring system 100 in accordance with an embodiment of the present disclosure is shown. The system 100 is operable between a charging mode and a transferring mode for measuring capacitance $C_x$ of a capacitive sensor 10, for example, a capacitive sensor for sensing touch or proximity of a conductive body. A parasitic capacitive element 12 with capacitance $C_p$ is coupled between a first end 10a of the capacitive sensor 10 and ground $V_{GND}$. The system 100 includes a first input terminal 101a for coupling a first end 10a of the capacitive sensor 10, and a second input terminal 101b for coupling a second end 10b of the capacitive sensor 10.

The system 100 includes a switching unit 102 coupled to the first and second ends 10a and 10b respectively through the first and second input terminals 101a and 101b, and a transferring unit 104, coupled to the switching unit 104, configured to discharge the capacitive sensor 10 in the transferring mode.

The switching unit 102 is configured to switch the system 100 between the charging mode and transferring mode by connecting and disconnecting the first end 10a of the capacitive sensor 10 to and from the transferring unit 104, and switching the system 100 between first and second phases in the charging mode. In one example, the switching unit 102 includes a first switch 106 coupled between a first supply voltage 14a and the first input terminal 101a, a second switch 108 coupled between the second input terminal 101b and ground $V_{GND}$, and a third switch 110 coupled between the second input terminal 101b and a second supply voltage 14b. The switching unit 102 further includes a fourth switch 112 coupled between the first input terminal 101a and an input node 114 of the transferring unit 104. The first to fourth switches 106 through 112 can be transistors operating between ON and OFF status respectively controlled by corresponding control signals $S_1$ to $S_4$.

In the charging mode, the fourth switch 112 is open to disconnect the transferring unit 104 from the capacitive sensor 10 and the parasitic capacitive element 12. In the first phase, the switching unit 102 arranges the capacitive sensor 10 to be charged by the first supply voltage 14a from the first end 10a of the capacitive sensor 10 until a voltage difference between the first and second ends 10a and 10b of the capacitive sensor 10 reaches a first predetermined voltage. In one example, in the first phase, the first and second switches 106 and 108 are closed and the third switch 110 is open, and the capacitive sensor 10 is charged by the first supply voltage 14a until a voltage $V_x$ at the first end 10a of the capacitive sensor 10 reaches the first predetermined voltage. In a preferred embodiment, the first predetermined voltage is proportional to the first supply voltage 14a. In another preferred embodiment, the first predetermined voltage is same as the first supply voltage 14a.

After the voltage difference between the first and second ends 10a and 10b of the capacitive sensor 10 reaches the first predetermined voltage, the switching unit 102 switches the system 100 from the first phase to the second phase of the charging mode by opening the first switch 106 to disconnect the first end 10a of the capacitive sensor 10 from the first supply voltage 14a, opening the second switch 108 and closing the third switch 110 to couple the second end 10b of the capacitive sensor 10 to the second supply voltage 14b, to raise the voltage $V_x$ at the first end 10a of the capacitive sensor 10 to a second predetermined voltage. In a preferred embodiment, an increase from the first predetermined voltage to the second predetermined voltage is based on the second supply voltage 14b and the capacitance $C_x$ of the capacitive sensor 10 and the capacitance $C_c$ of the parasitic capacitive element 12. In a preferred embodiment, the first and second supply voltages 14a and 14b are a same supply voltage $V_{reg}$ generated from and in proportion to a bandgap voltage reference $V_{bg}$ that is a temperature independent voltage reference. For example, the supply voltage $V_{reg}$ is 1.25$V_{bg}$. Where the bandgap voltage reference $V_{bg}$ is 1.2V with 50 ppm/C, the supply voltage $V_{reg}$ is 1.5V.

In one example, the second predetermined voltage is defined in accordance with the equation below:

$$V_x = V_{reg} + V_{reg}\left(\frac{C_x}{C_x + C_p}\right) \quad (1)$$

In a preferred embodiment, the capacitance $C_p$ of the parasitic capacitive element 12 is much smaller than the capacitance $C_x$ of the capacitive sensor 10, for example, being 1/100 to 1/10 of the capacitance $C_x$ of the capacitive sensor 10, the second predetermined voltage is approximately equal to 2$V_{reg}$. Compared to other methods where the voltage at the first end 10a is charged to the supply voltage $V_{reg}$, in the present disclosure, the anti-interference ability of the system 100 is strengthened by using the switching unit 102 to raise the voltage at the first end 10a of the capacitive sensor 10 to be higher than the supply voltage $V_{reg}$.

After the voltage $V_x$ at the first end 10a of the capacitive sensor 10 reaches the second predetermined voltage, the system 100 switches to the transferring mode by closing the fourth switch 112 to electrically couple the capacitive sensor 10 and the parasitic capacitive element 12 to the input node 114 of the transferring unit 104. In a preferred embodiment, the second end 10b of the capacitive sensor 10 remains being coupled to the second supply voltage 14b in the transferring mode.

In the transferring mode, the transferring unit 104 discharges the capacitive sensor 10 with a discharging current $I_{in}$ until the voltage $V_x$ at the first end 10a of the capacitive sensor 10 decreases to a third predetermined voltage in proportion to a reference voltage $V_{ref}$ provided to the transferring unit 104, and transfers a number of electric charges to a sample capacitor 116 having known capacitance $C_s$ by mirroring the discharging current $I_{in}$ from the capacitive sensor 10 to an output current $I_{out}$, and charges the sample capacitor 116 with the output current $I_{out}$. In a preferred embodiment, the reference voltage $V_{ref}$ is generated from and in proportion to the bandgap voltage reference $V_{bg}$, such that end point of discharging is well controlled. In a preferred embodiment, the reference voltage $V_{ref}$ is equal to the bandgap voltage reference $V_{bg}$.

The system 100 operates repeatedly between the charging and transferring modes until a voltage across the sample capacitor 116 reaches a trip voltage $V_{trip}$. The capacitance $C_x$ of the capacitive sensor 10 is determined based on cycles of a control signal $S_4$ that have been provided to the fourth switch 112 and the capacitance $C_s$ of the sample capacitor 116. In one example, the trip voltage $V_{trip}$ is also generated from and in proportion to the bandgap voltage reference $V_{bg}$. The capacitance $C_s$ of the sample capacitor 116 is large enough to store multiple times of the number of electric charges when the voltage across the sample capacitor 116 reaches the trip voltage $V_{trip}$.

In a preferred embodiment, a first end of the sample capacitor 116 is coupled to an output terminal 118 of the transferring unit 104 and a first input terminal of a comparator 120, and an opposite second end of the sample capacitor 116 is preferably coupled to ground $V_{GND}$. The comparator 118 compares the voltage at the first end of the sample capacitor 116 with the trip voltage $V_{trip}$, and generates a signal indicating that the voltage at the first end of the sample capacitor 116 reaches the trip voltage $V_{trip}$.

Figure 2:
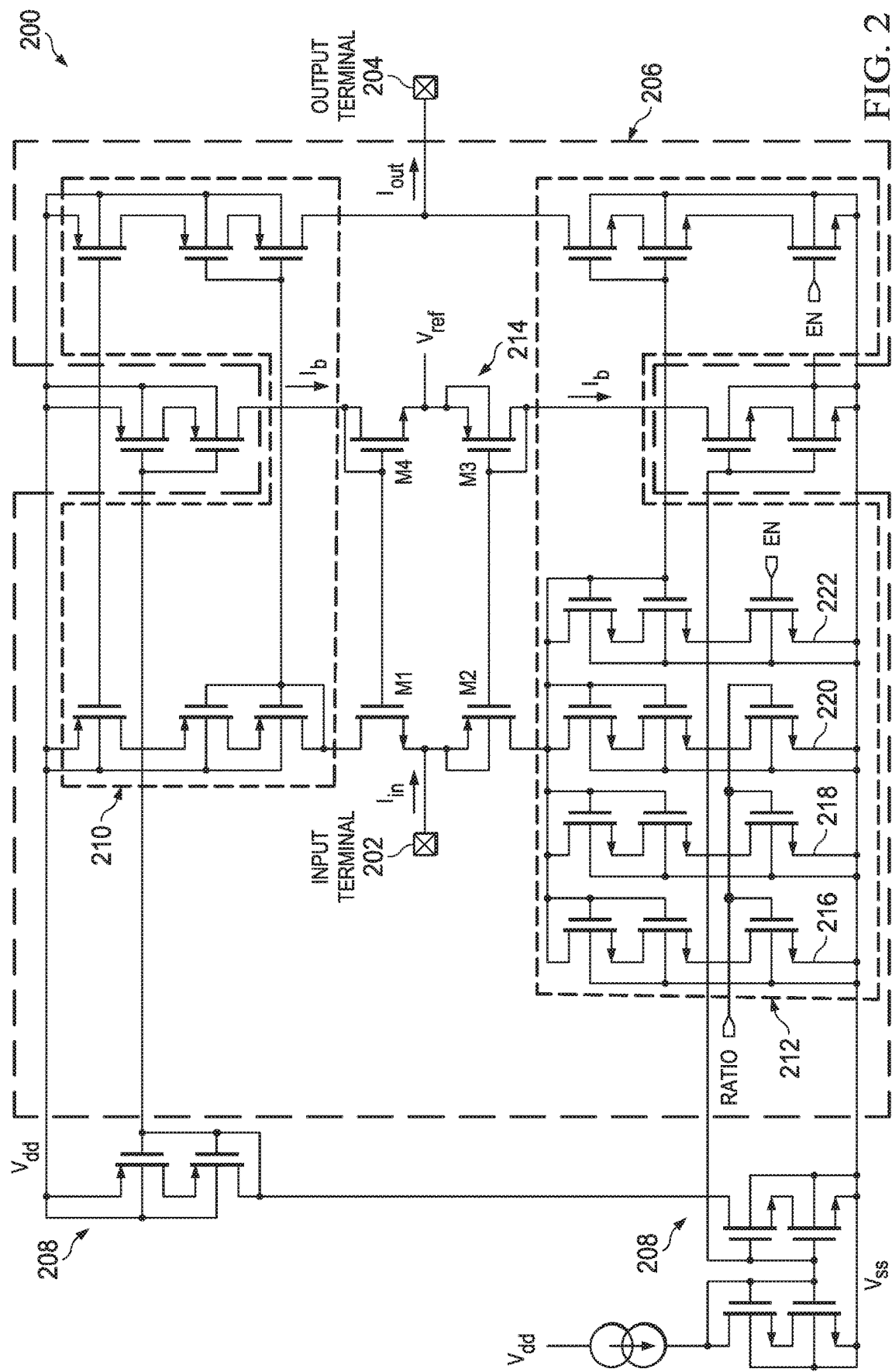
FIG. 2 is a schematic diagram of a transferring unit of the capacitance measuring system of FIG. 1 in accordance with an embodiment of the present disclosure.

FIG. 2 is a schematic diagram of a transferring unit 200 in accordance with an embodiment of the present disclosure. The transferring unit 200 can correspond to the transferring unit 104 of the capacitance measuring system 100 in the example of FIG. 1 that has an input node 202 configured to be electrically coupled to the first end 10a of the capacitive sensor 10 in the transferring mode, and an output terminal 204 configured to be coupled to the sample capacitor 116.

In a preferred embodiment, the transferring unit 200 includes a current mirror 206 that discharges the capacitive sensor 10 and the parasitic capacitive element 12 with the discharging current $I_{in}$ until the voltage $V_x$ at the first end 10b of the capacitive sensor 10a decreases to the second predetermined voltage, and transfers a number of electric charges to the sample capacitor 116 with the output current $I_{out}$ by mirroring the discharging current $I_{in}$ to the output current $I_{out}$, and a current source 208 that provides a bias current $I_b$ to the current mirror 206.

In a preferred embodiment, the current mirror 206 is a class AB current mirror that includes at least one PMOS current mirror 210 and at least one NMOS current mirror 212 coupled in series between third and fourth supply voltages $V_{dd}$ and $V_{ss}$, which allows to reduce the bias current relative to the discharging current $I_{in}$. The current mirror 206 also includes a translinear loop 214 coupled to the at least one PMOS current mirror 208 and at least one NMOS current mirror 210. The translinear loop 214 includes four transistors M1 through M4 coupled in a loop. The transistors M1 and M2 are coupled at source terminals thereof and cascaded between input sides of the at least one PMOS current mirror 208 and at least one NMOS current mirror 210, wherein the transistor M1 is a NMOS transistor with a drain terminal coupled to an input side of the at least one PMOS current mirror 208, and the transistor M2 is a PMOS transistor with a drain terminal coupled to an input side of the at least one NMOS current mirror 210. In one example, the input node 202 of the transferring unit 200 is coupled to source terminals of the transistor M1 and M2. The transistors M3 and M4 are coupled at source terminals thereof and have gate terminals respectively coupled to gate terminals of the transistors M2 and M1, and drain terminals respectively coupled to gate terminals thereof. The transistors M3 and M4 receive the bias current $I_b$ provided by the current source 208 respectively from drain terminals thereof and receive the reference voltage $V_{ref}$ at the source terminals thereof, and the transistors M1 and M2 provide the bias current $I_b$ to the at least one PMOS current mirror 208 and at least one NMOS current mirror 210 and set a bias voltage at the input node 202 of the transferring unit 200 based on the reference voltage $V_{ref}$.

In a preferred embodiment, a ratio of the output current $I_{out}$ over the discharging current $I_{in}$ is programmable by providing at least one programmable current mirror among the at least one PMOS current mirror 210 and at least one NMOS current mirror 212. As the example shown in FIG. 2, the input side of the NMOS current mirror 212 includes multiple current sinks 216 through 222. Gate terminals of transistors in the current sink 222 are coupled to gate terminals of corresponding transistors in the output side of the NMOS current mirror 212. The ratio is programmable by providing a ratio signal to gate terminals of the NMOS transistors in the current sinks 216 through 220. In another example, the NMOS current mirror 212 can be enabled or disabled by providing an enable signal to the gate terminals of the transistors in the current sink 222 and the output side. The at least one PMOS current mirror 210 can also be arranged in the same manner to be programmable.

Figure 3:
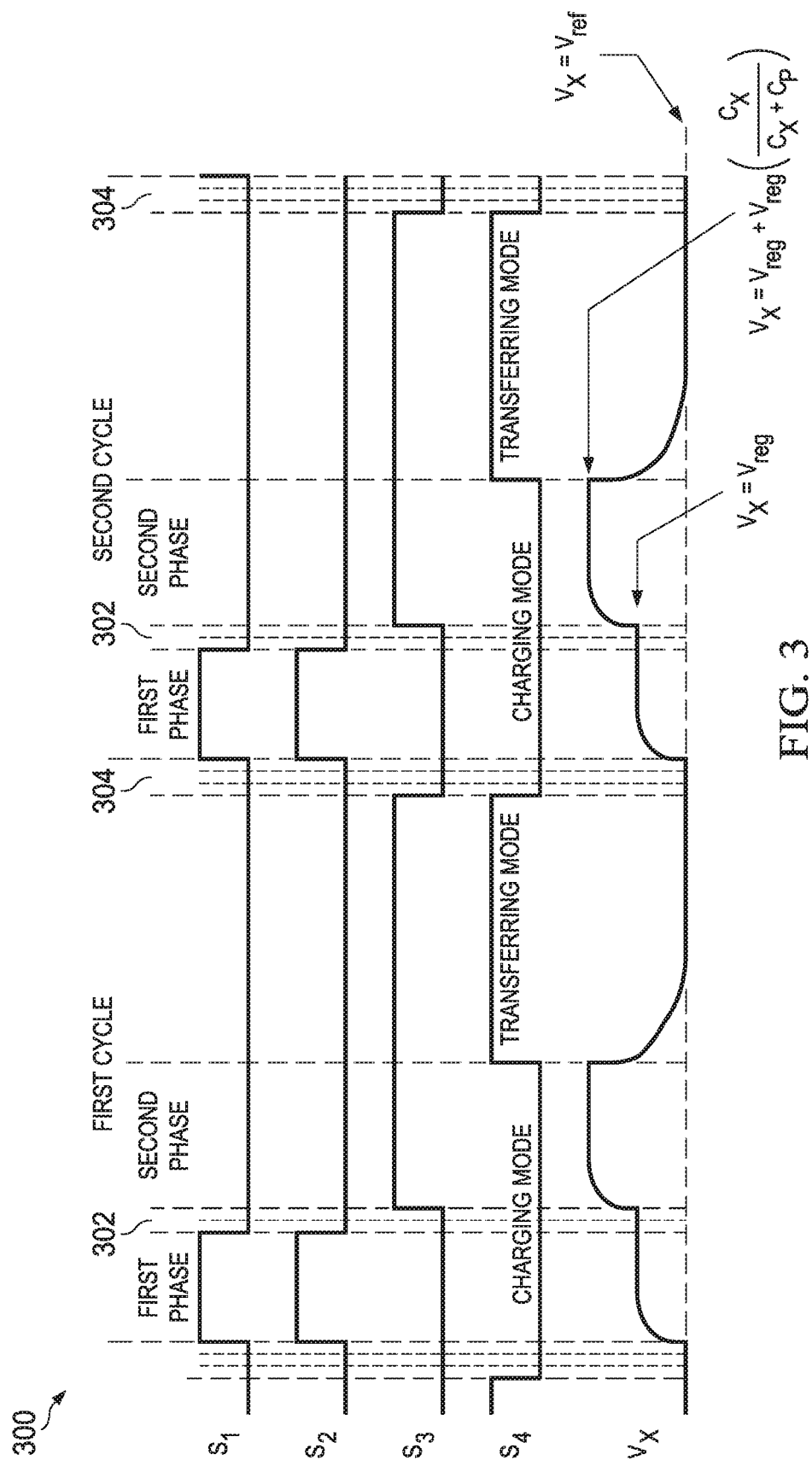
FIG. 3 is a waveform diagram illustrating change of a voltage at a first end of a capacitive sensor during charging and transferring modes under the control of switches of a switching unit of the capacitance measuring system of FIG. 1 in accordance with an embodiment of the present disclosure.

FIG. 3 is a waveform diagram 300 illustrating change of the voltage $V_x$ at the first end 10a of the capacitive sensor 10 during charging and transferring modes under the control of switches of the switching unit 102 of the capacitance measuring system 100 of FIG. 1 in accordance with an embodiment of the present disclosure.

Starting from a first cycle, in the charging mode, the fourth switch 112 is switched off, for example, by de-asserting the control signal $S_4$ provided to the fourth switch 112, to disconnect the transferring unit 104 from the capacitive sensor 10 and the parasitic capacitive element 12. In the first phase, the first switch 106 is switched on, for example, by asserting the control signal $S_1$ provided to the first switch 106, to couple the first end 10a of the capacitive sensor 10 to the supply voltage $V_{reg}$, and the second switch 108 is switched on and the third switch 110 is switched off respectively by the control signals $S_2$ and $S_3$ to couple the first end 10a of the capacitive sensor 10 to ground $V_{GND}$. The capacitive sensor 10 is charged by the supply voltage $V_{reg}$ until the voltage $V_x$ at the first end 10a reaches the first predetermined voltage, for example, the supply voltage $V_{reg}$.

The switching unit 102 then switches the system 100 from the first phase to the second phase of the charging mode by switching off the first and second switches 106 and 108 and switching on the third switch 110 to disconnect the first end 10a of the capacitive sensor 10 from the supply voltage $V_{reg}$ and couple the second end 10b of the capacitive sensor 10 to the supply voltage $V_{reg}$ to raise the voltage $V_x$ at the first end 10a of the capacitive sensor 10 to a second predetermined voltage. In a preferred embodiment, a first gap time 302 is provided between the first and second phases to ensure break-before-make switch action. In the second phase, the capacitive sensor 10 and the parasitic capacitive element 12 are coupled in series between the supply voltage $V_{reg}$ and ground $V_{GND}$. The increase from the first predetermined voltage to the second predetermined voltage is based on the capacitances $C_x$ and $C_p$ of the capacitive sensor 10 and the parasitic capacitive element 12. In a preferred embodiment, the second predetermined voltage is defined in accordance with the equation (1).

The switching unit 102 then switches the system 100 from the charging mode to the transferring mode by switching on the fourth switch 112, for example, asserting the control signal $S_4$, to couple the first end 10a of the capacitive sensor 10 to the transferring unit 104.

In the transferring mode, the transferring unit 104 discharges the capacitive sensor 10 until the voltage $V_x$ at the first end 10a of the capacitive sensor 10 decreases to a third predetermined voltage in proportion to a reference voltage $V_{ref}$ provided to the transferring unit 104. In a preferred embodiment, the third predetermined voltage is equal to the reference voltage $V_{ref}$ that is set to be the bias voltage at the input node 202 of the transferring unit 104. The number of electric charges transferred to the sample capacitor 116 is based on a voltage difference $\Delta V_x$ from the second to the third predetermined voltages at the first end 10a of the first capacitive sensor 10. In a preferred embodiment, the voltage difference $\Delta V_x$ is defined in accordance with the equation below:

$$\Delta V_x = V_{reg} + V_{reg}\left(\frac{C_x}{C_x + C_p}\right) - V_{ref} \qquad (2)$$

Therefore, where the capacitance $C_p$ of the parasitic capacitive element 12 is much smaller than the capacitance $C_x$ of the capacitive sensor 10, for example, being 1/100 to 1/10 of the capacitance $C_x$ of the capacitive sensor 10, the voltage difference $\Delta V_x$ is further defined in accordance with the equation below:

$$\Delta V_x = 2V_{reg} - V_{ref} \qquad (3)$$

The first cycle is followed by a subsequent second cycle which is same as the first cycle by switching on the first and second switches 106 and 108 and switching off the third and fourth switches 110 and 112 respectively by the control signals $S_1$ through $S_4$. In a preferred embodiment, a second gap time 304 is preferably provided after switching off the third and fourth switches 110 and 112 and before switching on the first and second switches 106 and 108 to ensure break-before-make switch action. Because both of the supply voltage $V_{reg}$ and reference voltage $V_{ref}$ are generated from and in proportion to the bandgap voltage reference $V_{bg}$ that is a temperature independent voltage reference, the number of electric charges transferred to the sample capacitor 116 in each cycle is more stable along with temperature and process.

Figure 4:
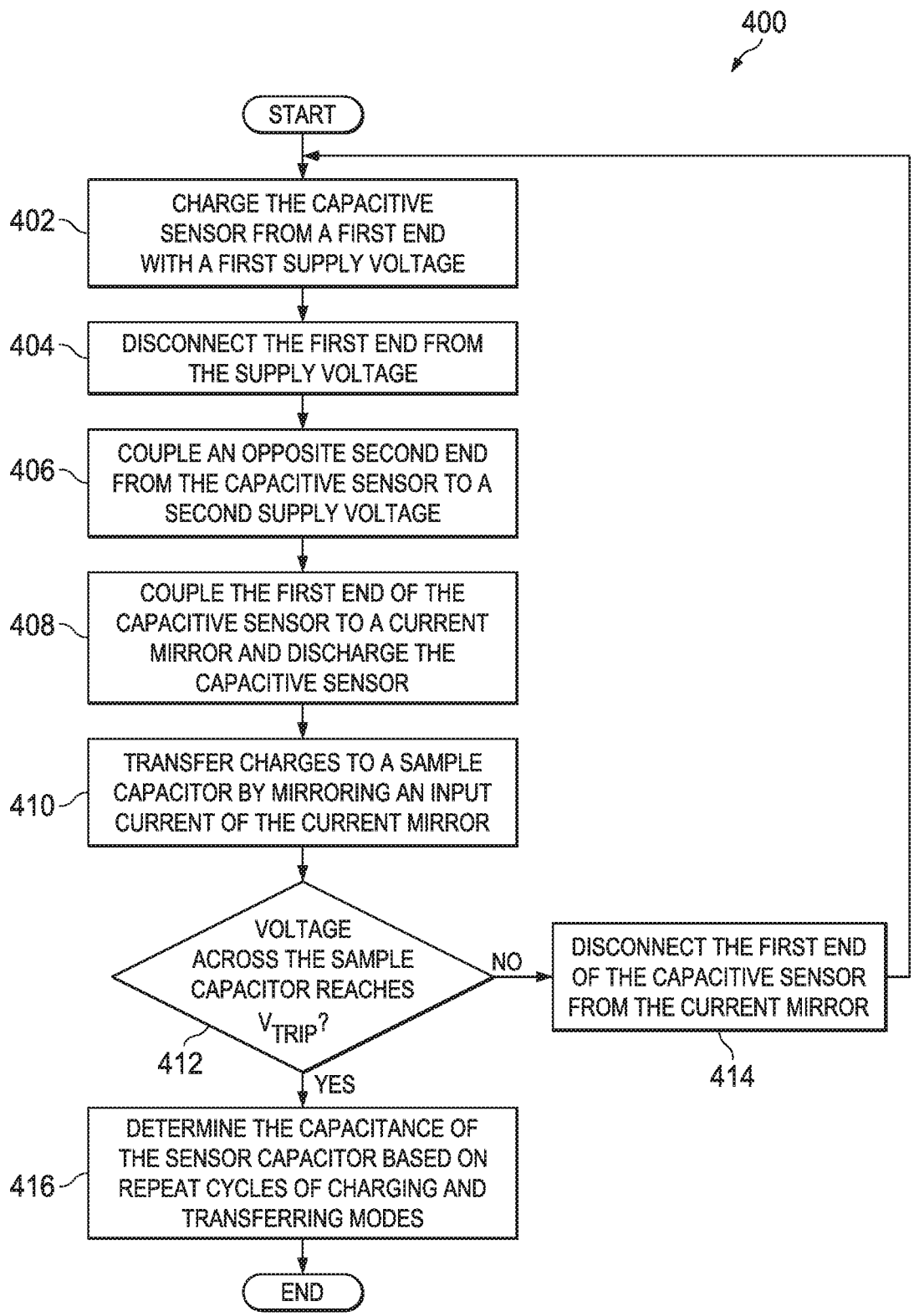
FIG. 4 is a flow chart of a method for measuring capacitance of a capacitive sensor in accordance with another embodiment of the present disclosure.

Referring to FIG. 4, a flow chart of a method 400 for measuring capacitance of a capacitive sensor with a capacitance measuring system in accordance with another embodiment of the present disclosure is shown. The capacitance measuring system, shown as the system 100 of FIG. 1, operable between a charging mode and a transferring mode, for measuring the capacitance of the capacitive sensor 10 for example, to sense touch or proximity of a conductive body. The system 100 includes a switching unit 102 selectively coupled the first and second ends 10a and 10b of the capacitive sensor 10 to first and second supply voltages to charge the capacitive sensor 10, and a transferring unit 104 coupled to the switching unit 102, configured for discharging the capacitive sensor 10 in the transferring mode and transfers a number of electric charges to a sample capacitor by mirroring a discharging current $I_{in}$ from the capacitive sensor 10 to measure the capacitance of the capacitive sensor 10.

Starting at step 402, the switching unit 102 couples the first end 10a of the capacitive sensor 10 to a first supply voltage 14a to charge the capacitive sensor 10 until a voltage difference between the first and second ends 10a and 10b of the capacitive sensor 10 reaches a first predetermined voltage. In a preferred embodiment, the first predetermined voltage is proportional to the first supply voltage 14a. In another preferred embodiment, said charging includes coupling the first end 10a of the capacitive sensor 10 to the first supply voltage 14a and coupling the second end 10b of the capacitive sensor 10 to ground $V_{GND}$, wherein the first predetermined voltage is same as the first supply voltage 14a.

At step 404, the switching unit 102 disconnects the first end 10a of the capacitive sensor 10 from the first supply voltage 14a. In a preferred embodiment, the switching unit 102 also disconnects the second end 10b of the capacitive sensor 10 from the ground $V_{GND}$.

At step 406, the switching unit 102 couples the second end 10b of the capacitive sensor 10 to a second supply voltage 14b to raise a voltage $V_x$ at the first end 10a of the capacitive sensor 10 to a second predetermined voltage. In a preferred embodiment, the first and second supply voltages 14a and 14b is a same supply voltage $V_{reg}$ generated from and in proportion to a bandgap voltage reference $V_{bg}$ that is a temperature independent voltage reference. For example, the supply voltage $V_{reg}$ is $1.25V_{bg}$. Where the bandgap voltage reference $V_{bg}$ is 1.2V with 50 ppm/C, the supply voltage $V_{reg}$ is 1.5V. The increase from the first predetermined voltage to the second predetermined voltage is based on the capacitances $C_x$ and $C_p$ of the capacitive sensor 10 and the parasitic capacitive element 12. In a preferred embodiment, the second predetermined voltage is defined in accordance with the equation (1). In a preferred embodiment, a first gap time 302 is provided between the steps 404 and 406 to ensure break-before-make switch action.

At step 408, the switching unit 102 switches the system 100 from the charging mode to the transferring mode by electrically coupling the first end 10a of the capacitive sensor 10 to an input node of a current mirror of the transferring unit 104. The current mirror, for example, shown as the current mirror 206 in FIG. 2, discharges the capacitive sensor 10 until the voltage $V_x$ at the first end 10a of the capacitive sensor 10 decreases to a third predetermined voltage. The third predetermined voltage is in proportion to a reference voltage $V_{ref}$ provided to the transferring unit 104. In a preferred embodiment, the third predetermined voltage is equal to the reference voltage $V_{ref}$ that is set to be the bias voltage at the input node 114 of the transferring unit 104. In a preferred embodiment, the reference voltage $V_{ref}$ is generated from and in proportion to the bandgap voltage reference $V_{bg}$. In a preferred embodiment, the reference voltage $V_{ref}$ is equal to the bandgap voltage reference $V_{bg}$. In a preferred embodiment, the current mirror 206 is a class AB current mirror that includes at least one PMOS current mirror 210 and at least one NMOS current mirror 212 coupled in series between third and fourth supply voltages $V_{dd}$ and $V_{ss}$, which allows to reduce the bias current relative to the discharging current $I_{in}$.

At step 410, the current mirror 206 transfers the number of electric charges to the sample capacitor 116 by mirroring the discharging current $I_{in}$ to an output current $I_{out}$ that charges the sample capacitor 116. The number of electric charges is based on a voltage difference $\Delta V_x$ from the second to the third predetermined voltages at the first end 10a of the first capacitive sensor 10. In a preferred embodiment, the voltage difference $\Delta V_x$ is defined in accordance with the equation (2). Where the capacitance $C_p$ of the parasitic capacitive element 12 is much smaller than the capacitance $C_x$ of the capacitive sensor 10, for example, being 1/100 to 1/10 of the capacitance $C_x$ of the capacitive sensor 10, the voltage difference $\Delta V_x$ is further defined in accordance with the equation (3).

At step 412, the system 100 determines whether a voltage across the sample capacitor 116 reaches a trip voltage $V_{trip}$. In one example, the trip voltage $V_{trip}$ is also generated from and in proportion to the bandgap voltage reference $V_{bg}$. The capacitance $C_s$ of the sample capacitor 116 is large enough to store multiple times of the number of electric charges when the voltage across the sample capacitor 116 reaches the trip voltage $V_{trip}$.

At step 414, if the voltage across the sample capacitor 116 does not reach the trip voltage $V_{trip}$, the system 100 switches from the transferring mode back to the charging mode by disconnecting the first end 10a of the capacitive sensor 10 from the current mirror 206 of the transferring unit 104 and goes back to step 402 to start another cycle. In a preferred embodiment, a second gap time 304 is preferably provided between steps 414 and 402 to ensure break-before-make switch action.

The cycle is repeated until the voltage across the sample capacitor 116 reaches the trip voltage $V_{trip}$. Because both of the supply voltage $V_{reg}$ and reference voltage $V_{ref}$ are generated from and in proportion to the bandgap voltage reference $V_{bg}$ that is a temperature independent voltage reference, the number of electric charges transferred to the sample capacitor 116 in each cycle is stable along with temperature and process.

At step 416, if the voltage across the sample capacitor 116 reaches the trip voltage $V_{trip}$, the system 100 determines the capacitance $C_x$ based on repeat cycles of the charging and transferring mode, the voltage difference $\Delta V_x$ provided by equation (3), and the capacitance $C_s$ of the sample capacitor 116.

The description of the preferred embodiments of the present disclosure has been presented for purposes of illustration and description, but is not intended to be exhaustive or to limit the invention to the forms disclosed. Numerous modifications, changes, variations, substitutions, and equivalents will be apparent to those skilled in the art, without departing from the spirit and scope of the present disclosure, as described in the claims.

The invention claimed is:

1. A system operable between a charging mode and a transferring mode, comprising:
   a first input terminal configured to couple a first end of a capacitive sensor and a second input terminal configured to couple a second end of the capacitive sensor;
   a switching unit coupled to the first and second input terminals, and configured to:
   in a first phase of the charging mode, arrange the capacitive sensor to be charged by a first supply voltage from a first end of the capacitive sensor until a voltage difference between the first and second ends of the capacitive sensor reaches a first predetermined voltage, and in a second phase of the charging mode, disconnect the first end of the capacitive sensor from the first supply voltage and couple the second end of the capacitive sensor to a second supply voltage to raise a voltage at the first end of the capacitive sensor to a second predetermined voltage; and a transferring unit with an input node configured to be electrically coupled to the first end of the capacitive sensor in the transferring mode, comprising:
  a current mirror configured to discharge the capacitive sensor with a discharging current until the voltage at the first end of the capacitive sensor decreases to a third predetermined voltage, and transfer a number of electric charges to a sample capacitor by mirroring the discharging current;
  wherein the current mirror is configured to set a bias voltage at the input node of the transferring unit based on a reference voltage, wherein the third predetermined voltage is based on the bias voltage; and
  wherein the current mirror comprises at least PMOS current mirror and at least one NMOS current mirror coupled in series, and a translinear loop coupled to the at least one PMOS current mirror and at least one NMOS current mirror, the translinear loop receiving the reference voltage and setting the bias voltage at the input node of the transferring unit.

2. The system of claim 1, wherein the switching unit comprises:
  a first switch coupled between the first input terminal and the first supply voltage;
  a second switch coupled between the second input terminal and ground; and
  a third switch coupled between the second input terminal and the second supply voltage,
  wherein in the first phase, the first and second switches are closed and the third switch is open to charge the capacitive sensor from the first end thereof, and in the second phase, the first and second switches are open and the third switch is closed to raise the voltage at the first end of the capacitive sensor to the second predetermined voltage.

3. The system of claim 1, wherein the first predetermined voltage is based on the first supply voltage and the second predetermined voltage is based on the first and second supply voltages.

4. The system of claim 1, wherein the first and second supply voltages are a same supply voltage.

5. The system of claim 1, wherein the reference voltage is based on a bandgap voltage reference.

6. A system operable between a charging mode and a transferring mode, comprising:
  a first input terminal configured to couple a first end of a capacitive sensor; and
  a transferring unit with an input node configured to be electrically coupled to the first end of the capacitive sensor in the transferring mode, comprising:
    a current mirror configured to discharge the capacitive sensor with a discharging current until a voltage at the first end of the capacitive sensor decreases to a first predetermined voltage and transfers a number of electric charges to a sample capacitor by mirroring the discharging current;
    wherein the current mirror is configured to set a bias voltage at the input node of the transferring unit based on a reference voltage, wherein the first predetermined voltage is based on the bias voltage; and
    wherein the current mirror comprises at least one PMOS current mirror and at least one NMOS current mirror coupled in series, and a translinear loop coupled to the at least one PMOS current mirror and at least one NMOS current mirror, the translinear loop receiving the reference voltage and setting the bias voltage at the input node of the transferring unit.

7. The system of claim 6, wherein the reference voltage is based on a bandgap voltage reference.

8. The system of claim 6, further comprising:
  a second input terminal configured to couple a second end of the capacitive sensor; and
  a switching unit coupled to the first and second input terminals, and configured to:
    in a first phase of the charging mode, arrange the capacitive sensor to be charged by a first supply voltage from the first end of the capacitive sensor until a voltage difference between the first and second ends of the capacitive sensor reaches a second predetermined voltage, and
    in the second phase, disconnect the first end of the capacitive sensor from the first supply voltage and couple the second end of the capacitive sensor to a second supply voltage to raise a voltage at the first end of the capacitive sensor to a third predetermined voltage.

9. The system of claim 8, wherein the switching unit comprises:
  a first switch coupled between the first input terminal and the first supply voltage;
  a second switch coupled between the second input terminal and ground; and
  a third switch coupled between the second input terminal and the second supply voltage,
  wherein in the first phase, the first and second switches are closed and the third switch is open to charge the capacitive sensor from the first end thereof, and in the second phase, the first and second switches are open and the third switch is closed to raise the voltage at the first end of the capacitive sensor to the third predetermined voltage.

10. The system of claim 8, wherein the second predetermined voltage is based on the first supply voltage, and the third predetermined voltage is based on the first and second supply voltages.

11. The system of claim 8, wherein the first and second supply voltages are a same supply voltage.

12. A method of measuring capacitance of a capacitive sensor, comprising:
  coupling a first end of the capacitive sensor to a first supply voltage to charge the capacitive sensor from the first end until a voltage difference between the first end and a second end of the capacitive sensor reaches a first predetermined voltage;
  disconnecting the first end of the capacitive sensor from the first supply voltage, and coupling the second end of the capacitive sensor to a second supply voltage to raise a voltage at the first end of the capacitive sensor to from the first predetermined voltage to a second predetermined voltage;
  providing a reference voltage to a current mirror of a transferring unit;
  setting a bias voltage at an input node of the transferring unit based on the reference voltage;
  coupling the input node of the transferring unit to the first end of the capacitive sensor; and discharging, by the transferring unit, the capacitive sensor with a discharging current unit a voltage at the first end of the capacitive sensor reaches a third predetermined voltage, wherein the third predetermined voltage is based on the bias voltage;

wherein the current mirror comprises at least one PMOS current mirror and at least one NMOS current mirror coupled in series, and a translinear loop coupled to the at least one PMOS current mirror and at least one NMOS current mirror, the translinear loop receiving the reference voltage and setting the bias voltage at the input node of the transferring unit.

13. The method of claim 12, wherein the first predetermined voltage is based on the first supply voltage and the second predetermined voltage is based on the first and second supply voltages, and wherein the first and second supply voltages are a same supply voltage.

14. The method of claim 12, wherein the reference voltage is based on a bandgap voltage reference.

15. The method of claim 12, further comprising:
transferring, by the transferring unit, a number of electric charges to a sample capacitor by mirroring the discharging current.

\* \* \* \* \*